(12) United States Patent
Nakamura et al.

(10) Patent No.: US 10,110,148 B2
(45) Date of Patent: Oct. 23, 2018

(54) STEPPING MOTOR CONTROL DEVICE, COMPONENT MOUNTING MACHINE PROVIDED WITH STEPPING MOTOR CONTROL DEVICE, AND STEPPING MOTOR CONTROL METHOD

(71) Applicant: FUJI CORPORATION, Chiryu (JP)

(72) Inventors: Daisuke Nakamura, Chiryu (JP); Akira Hara, Toyohashi (JP); Satoshi Osaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 176 days.

(21) Appl. No.: 15/121,082

(22) PCT Filed: Feb. 25, 2014

(86) PCT No.: PCT/JP2014/054477
§ 371 (c)(1),
(2) Date: Aug. 24, 2016

(87) PCT Pub. No.: WO2015/128932
PCT Pub. Date: Sep. 3, 2015

(65) Prior Publication Data
US 2016/0365812 A1    Dec. 15, 2016

(51) Int. Cl.
*H02P 8/30* (2006.01)
*H05K 13/00* (2006.01)
(Continued)

(52) U.S. Cl.
CPC .............. *H02P 8/30* (2013.01); *H02P 8/24* (2013.01); *H05K 13/0061* (2013.01);
(Continued)

(58) Field of Classification Search
CPC ........................................................ H02P 8/30
(Continued)

(56) References Cited

U.S. PATENT DOCUMENTS

| 5,132,603 A | 7/1992 | Yoshimoto |
| 5,304,910 A * | 4/1994 | Loncle ............. F02D 11/107 318/685 |

(Continued)

FOREIGN PATENT DOCUMENTS

| EP | 2 528 425 A2 | 11/2012 |
| EP | 2 733 562 A1 | 5/2014 |

(Continued)

OTHER PUBLICATIONS

International Search Report dated May 20, 2014 in PCT/JP2014/054477 filed Feb. 25, 2014.

(Continued)

*Primary Examiner* — David S Luo
(74) *Attorney, Agent, or Firm* — Oblon, McClelland, Maier & Neustadt, L.L.P.

(57) ABSTRACT

A stepping motor control device is provided with a stopping position determination section and a drive control section. The stopping position determination section determines whether a mover stopping position during the holding state is a stabilized phase or a semistable phase. When it is determined that the mover stopping position is a semistable phase during the holding state by the stopping position determination section, and the control state of the stepping motor transitions from the holding state to the standby state in which the holding of the mover is released due to a trigger signal from a device or the holding state persisting for a fixed time, the drive control section changes the mover stopping position to one of the stabilized phases adjacent to the mover stopping position during the holding state.

6 Claims, 6 Drawing Sheets

(51) Int. Cl.
*H05K 13/02* (2006.01)
*H05K 13/04* (2006.01)
*H05K 13/08* (2006.01)
*H02P 8/24* (2006.01)

(52) U.S. Cl.
CPC ......... *H05K 13/02* (2013.01); *H05K 13/0408* (2013.01); *H05K 13/08* (2013.01)

(58) Field of Classification Search
USPC ........................................ 318/685, 671, 560
See application file for complete search history.

(56) References Cited

U.S. PATENT DOCUMENTS

| | | | |
|---|---|---|---|
| 7,948,200 B2 | 5/2011 | Fukunaga et al. | |
| 2013/0008019 A1 | 1/2013 | Abe | |

FOREIGN PATENT DOCUMENTS

| | | |
|---|---|---|
| GB | 2 238 919 A | 6/1991 |
| JP | 2003-102197 A | 4/2003 |
| JP | 2008-259403 A | 10/2008 |
| JP | 2011-61967 A | 3/2011 |
| JP | 2012-44018 A | 3/2012 |
| WO | WO 2013/008530 A1 | 1/2013 |

OTHER PUBLICATIONS

Extended European Search Report dated Feb. 21, 2017 in Patent Application No. 14883762.8.
Office Action dated Sep. 26, 2017 in Japanese Patent Application No. 2016-504881 (with unedited, computer generated English translation).
AWCombined Office Action and Search Report dated Apr. 4, 2018 in Chinese Patent Application No. 201480076208.X with partial English translation and English translation of categories of cited documents.

\* cited by examiner

FIG. 6
| No | STATOR MAGNETIC POLE | | | | MOVER R1 STOPPING POSITION |
|---|---|---|---|---|---|
| | SC1 | SC3 | SC2 | SC4 | |
| 1 | ON (S POLE) | ON (N POLE) | OFF | OFF | P1 |
| 2 | ON (S POLE) | ON (N POLE) | ON (S POLE) | ON (N POLE) | P2 |
| 3 | OFF | OFF | ON (S POLE) | ON (N POLE) | P3 |
| 4 | ON (N POLE) | ON (S POLE) | ON (S POLE) | ON (N POLE) | P4 |
| 5 | ON (N POLE) | ON (S POLE) | OFF | OFF | P5 |
| 6 | ON (N POLE) | ON (S POLE) | ON (N POLE) | ON (S POLE) | P6 |
| 7 | OFF | OFF | ON (N POLE) | ON (S POLE) | P7 |
| 8 | ON (S POLE) | ON (N POLE) | ON (N POLE) | ON (S POLE) | P8 |
FIG. 7
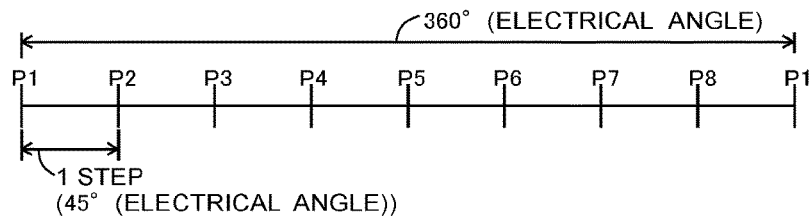
FIG. 8
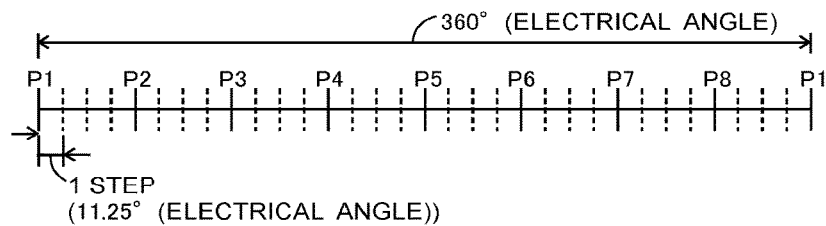

STEPPING MOTOR CONTROL DEVICE, COMPONENT MOUNTING MACHINE PROVIDED WITH STEPPING MOTOR CONTROL DEVICE, AND STEPPING MOTOR CONTROL METHOD

TECHNICAL FIELD

The present application relates to a stepping motor control device, a component mounting machine provided with the stepping motor control device, and a stepping motor control method. More specifically, the present application relates to the control of a stepping motor in a standby state.

BACKGROUND ART

A disclosure described in PTL 1 is given as an example of the stepping motor control device. In a motor drive device described in PTL 1, stop control means for controlling the stopping of a rotor is provided at a position (a two-phase excitation position) at which the rotor moves commonly in a plurality of excitation modes. Accordingly, in the disclosure described in PTL 1, the movement amount from the rotor stopping position when restarting the rotor is fixed, and it is ensured that the operation of the rotor is not inconsistent.

CITATION LIST

Patent Literature

PTL 1: JP-A-2008-259403

SUMMARY

However, the disclosure described in PTL 1 stops the rotor in a two-phase excitation position, and does not change the rotor stopping position at a predetermined timing after the rotor stops. In the disclosure described in PTL 1, the power consumption (the standby power) of the stepping motor in the standby state is not considered.

The present disclosure was made in light of these issues, and an object thereof is to provide a stepping motor control device capable of positioning a stepping motor at a desired target position and capable of reducing the power consumption of the stepping motor in a standby state in which a holding state of the positioning is released, a component mounting machine provided with the stepping motor control device, and a stepping motor control method.

A stepping motor control device of the present disclosure is a stepping motor control device which controls a stepping motor using half-step driving or micro-step driving, including a stopping position determination section which, when positions corresponding to stator magnetic poles are set to stabilized phases and intermediate positions between the stabilized phases which are adjacent are set to semistable phases among mover stopping positions of the stepping motor, determines which of the stabilized phases and semistable phases the mover stopping position is during a holding state in which the mover reaches an instructed target position and is held at the target position, and a drive control section which, when it is determined that the mover stopping position is the semistable phase during the holding state by the stopping position determination section, and the control state of the stepping motor transitions from the holding state to a standby state in which holding of the mover is released due to a trigger signal from a device or the holding state persisting for a fixed time, changes the mover stopping position to one of the stabilized phases adjacent to the mover stopping position during the holding state.

A stepping motor control device of the present disclosure is provided with a stopping position determination section and a drive control section. Accordingly, the drive control section is capable of setting the stepping motor to the standby state in a stabilized phase in which the power consumption is low in comparison to a semistable phase based on the determination results of the stopping position determination section. Therefore, the stepping motor control device of the present embodiment is capable of positioning the stepping motor at a desired target position and of reducing the power consumption of the stepping motor in the standby state in which the holding state of the positioning is released.

A component mounting machine of the present disclosure includes a board conveyance device which carries a board to and from a mounting position, a component supply device which includes a feeder which supplies components to be mounted onto the board, and a component transfer device which sucks the components from the feeder and mounts the components onto the board which is carried to the mounting position, in which the feeder includes a feeder main body section, a component supply reel onto which a component tape which stores a plurality of components is wound, a sprocket which pitch feeds the component tape, a stepping motor which causes the sprocket to rotate, and the stepping motor control device which controls the stepping motor.

According to the component mounting machine of the present disclosure, the stepping motor control device is provided in the feeder. Accordingly, the stepping motor control device is capable of reducing the standby power of the feeder. Since the stepping motor control device is capable of reducing the standby power of the feeder, it is possible to reduce the amount of generated heat during standby of the feeder, and to suppress the static electricity which occurs in the feeder. Accordingly, in the component mounting machine of the present disclosure, the standby power of the feeder is reduced, and a heat generation countermeasure and a static electricity countermeasure of the feeder are reduced.

A stepping motor control method of the present disclosure is a stepping motor control method which controls a stepping motor using half-step driving or micro-step driving, including a stopping position determination step of, when positions corresponding to stator magnetic poles are set to stabilized phases and intermediate positions between the stabilized phases which are adjacent are set to semistable phases among mover stopping positions of the stepping motor, determining which of the stabilized phases and semistable phases the mover stopping position is during a holding state in which the mover reaches an instructed target position and is held at the target position, and a drive control step of, when it is determined that the mover stopping position is the semistable phase during the holding state by the stopping position determination step, and the control state of the stepping motor transitions from the holding state to a standby state in which holding of the mover is released due to a trigger signal from a device or the holding state persisting for a fixed time, changing the mover stopping position to one of the stabilized phases adjacent to the mover stopping position during the holding state.

The stepping motor control method of the present disclosure is provided with the stopping position determination step and the drive control step. Accordingly, the drive control step is capable of setting the stepping motor to the standby state in a stabilized phase in which the power consumption is low in comparison to a semistable phase based on the determination results of the stopping position determination step. Therefore, the stepping motor control method of the present embodiment is capable of positioning the stepping motor at a desired target position and of reducing the power consumption of the stepping motor in the standby state in which the holding state of the positioning is released.

BRIEF DESCRIPTION OF DRAWINGS

FIG. 6 is an explanatory diagram explaining an example of excitation patterns.

FIG. 7 is an explanatory diagram explaining a step angle by half-step driving.

FIG. 8 is an explanatory diagram explaining a step angle by micro-step driving.

DESCRIPTION OF EMBODIMENTS

The stepping motor control device 1 of the present embodiment is provided in the feeder 41 of the component mounting machine 2.

Component Mounting Machine 2

Figure 1:
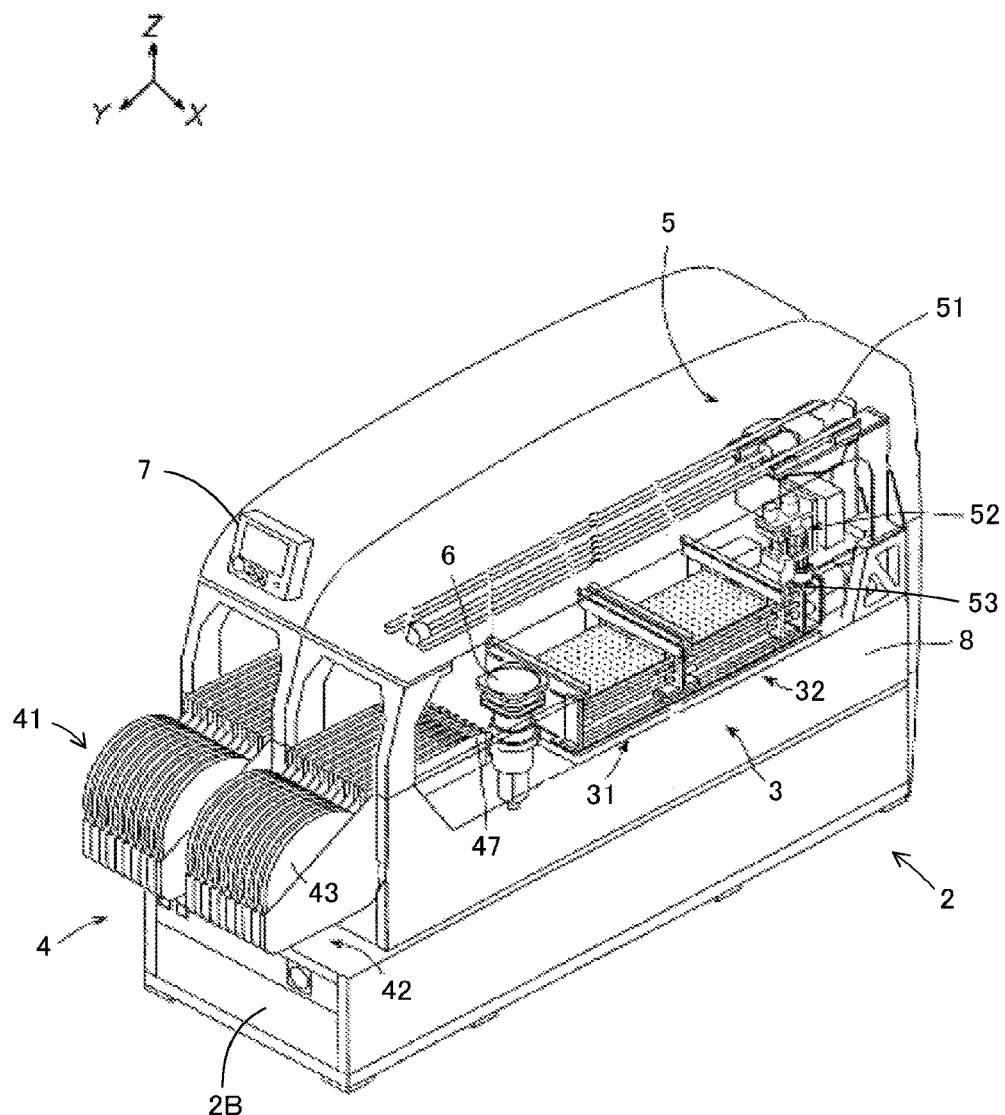
FIG. 1 is a perspective diagram illustrating an example of a component mounting machine 2.

FIG. 1 is a perspective diagram illustrating an example of the component mounting machine 2. In FIG. 1, a horizontal direction (an arrow X direction) indicates a conveyance direction of a board, and a longitudinal direction (an arrow Y direction) indicates a direction orthogonally intersecting the horizontal direction (the arrow X direction) in a horizontal plane. A height direction (an arrow Z direction) indicates the normal direction of the horizontal plane. The component mounting machine 2 includes a board conveyance device 3, a component supply device 4, a component transfer device 5, the component camera 6, and the control device 7, and these are assembled on a base 8. The base 8 is mounted to a system base 2B to be capable of moving in the longitudinal direction (the arrow Y direction).

The board conveyance device 3 carries the board to and from a mounting position. The board conveyance device 3 is arranged in the vicinity of the center of the longitudinal direction (the arrow Y direction) of the component mounting machine 2, and is a so-called double conveyor type conveyance device in which a first conveyance device 31 and a second conveyance device 32 are provided to line up. The first conveyance device 31 includes a pair of guide rails which are provided to line up parallel to the horizontal direction (the arrow X direction) on the base 8, and a pair of conveyor belts which are guided by the pair of guide rails, onto which the board is placed, and which convey the board. A clamping device which pushes up the board which is conveyed to the mounting position from the base 8 and positions the board is provided on the first conveyance device 31. The second conveyance device 32 has the same configuration as the first conveyance device 31.

The component supply device 4 includes the feeder 41 which is provided on a front portion (a left direction side of the paper of FIG. 1) in the longitudinal direction (the arrow Y direction) of the component mounting machine 2, and supplies the components to be mounted onto the board. A plurality of the cassette feeders 41 are attached to the slots 42 in a detachable manner. A plurality of the slots 42 are provided in a series along the horizontal direction (the arrow X direction) of the component mounting machine 2, the feeders are slid in the longitudinal direction (the arrow Y direction) into the slots 42, engage with the slots 42, and thus, the feeders 41 are mounted to the slots 42.

Figure 2:
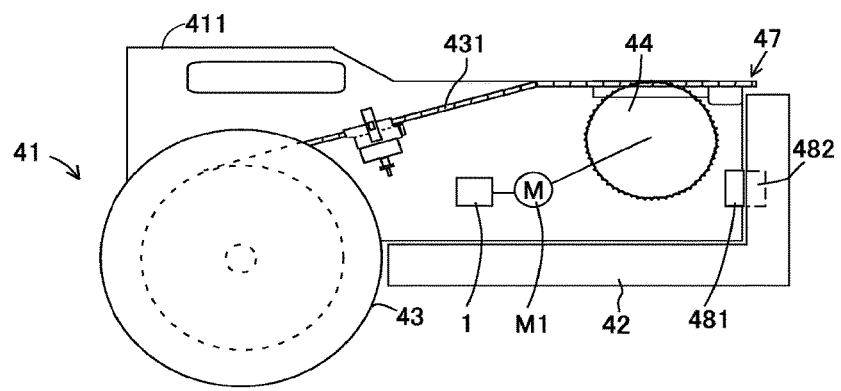
FIG. 2 is a schematic diagram schematically illustrating a connecting portion between a feeder 41 and a slot 42.

FIG. 2 is a schematic diagram schematically illustrating a connecting portion between the feeder 41 and the slot 42. The feeder 41 is provided with a feeder main body section 411, a component supply reel 43, a sprocket 44, the stepping motor M1, and the stepping motor control device 1.

The component supply reel 43 is a component supply medium, and a component tape 431 in which a plurality of components are stored in a row at a predetermined interval is wound onto the component supply reel 43. In the present embodiment, the component supply reel 43 is mounted to the feeder main body section 411 to be capable of rotating and to be capable of attaching and detaching. The component supply reel 43 may be provided with a different member from the feeder main body section 411. The tip portion of the component tape 431 is pulled out to a component pickup section 47 which is provided on the tip portion of the feeder 41, and the components are supplied. The feeder 41 is capable of supplying comparatively small components such as chip components, for example.

The sprocket 44 pitch feeds the component tape 431 of the component supply reel 43. The sprocket 44 is supported by the feeder main body section 411 to be capable of rotating. One or a plurality of toothed wheels (not illustrated) are interposed between the stepping motor M1 and the sprocket 44, the rotation of the stepping motor M1 is transmitted to the sprocket 44 via the toothed wheels, and the sprocket 44 rotates. Specifically, feed holes are formed in the component tape 431 in the pitch feed direction, the pitch holes of the component tape 431 and the protruding sections of the sprocket 44 engage with each other, and the component tape 431 is pitch fed. As a result, the components are sequentially supplied to the component pickup section 47. As described later, the stepping motor M1 is controlled by the stepping motor control device 1.

A communication connector 481 is provided on the tip portion of the feeder 41. When the feeder 41 is mounted to the slot 42, the communication connector 481 is connected to a communication connector 482 which is provided in the slot 42. The communication connector 482 is connected to the control device 7 which is described later, is capable of supplying power from the slot 42 side to the feeder 41, and the feeder 41 is capable of transmitting and receiving various data and control signals between the feeder 41 and the control device 7.

The component transfer device 5 sucks a component from the feeder 41 and mounts the component onto a board which is carried to the mounting position. The component transfer device 5 is a so-called XY robot type transfer device capable of moving in the horizontal direction (the arrow X direction) and the longitudinal direction (the arrow Y direction). The component transfer device 5 is arranged from the rear portion (the far side in the right direction of the paper of FIG. 1) in the longitudinal direction (the arrow Y direction) of the component mounting machine 2 to above the component supply device 4 of the front portion (the near side in the left direction of the paper of FIG. 1). The component transfer device 5 includes a head driving mechanism 51 and a component mounting head 52.

The head driving mechanism 51 is capable of driving the component mounting head 52 in the horizontal direction (the arrow X direction) and the longitudinal direction (the arrow Y direction). The component mounting head 52 includes a plurality of suction nozzles 53. Each of the plurality of suction nozzles 53 sucks a component at the tip portion of the suction nozzle 53, and mounts the component onto a board which is carried to and positioned at the mounting position.

The component camera 6 is arranged on the base 8 between the component pickup section 47 of the component supply device 4 and the first conveyance device 31 of the board conveyance device 3. The component camera 6 images a component which is sucked and held by the suction nozzle 53 of the component mounting head 52. The component camera 6 is capable of imaging a plurality of components which are sucked and held by the plurality of suction nozzles 53 at once.

The image data captured by the component camera 6 is transmitted to an image processing device. In the present embodiment, the image processing device is provided in the control device 7; however, it is possible to provide the image processing device in a different computing device from the control device 7. The image processing device acquires the suction state of the components from the image which is captured by the component camera 6. The image processing device is capable of determining the suitability of the components from the captured image, and is capable of determining the quality of the suction state of the components. For example, the image processing device is capable of detecting positional shifting and angular shifting of the components in relation to the suction nozzles 53, and the detection results may be used when correcting the mounting positions of the components.

Figure 3:
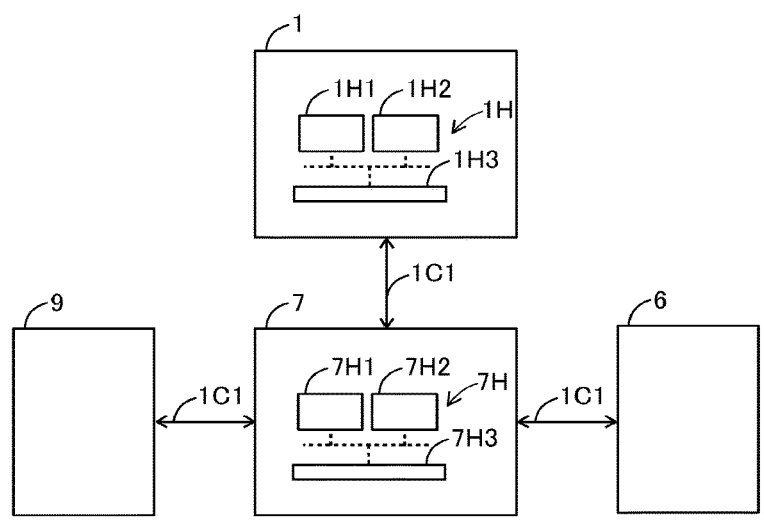
FIG. 3 is a block diagram illustrating the relationship between a stepping motor control device 1, a control device 7, a component camera 6, and a host computer 9.

FIG. 3 is a block diagram illustrating the relationship between the stepping motor control device 1, the control device 7, the component camera 6, and the host computer 9. FIG. 3 mainly depicts the connection state relating to the stepping motor control device 1 which is described later. As illustrated in FIG. 3, the stepping motor control device 1 includes a well-known microcomputer 1H. The microcomputer 1H is provided with a CPU 1H1, a memory 1H2, and a communication interface 1H3.

The CPU 1H1 is a central computing device, and is capable of performing various computations. The memory 1H2 is a readable and writable storage device, and is capable of storing various electronic information. The communication interface 1H3 is an interface which performs communication with the control device 7, and it is possible to use a well-known LAN interface, for example.

The control device 7 of the component mounting machine 2 is arranged on a top portion of the front side of the cover illustrated in FIG. 1, and includes a microcomputer 7H similar to that of the stepping motor control device 1. Specifically, the microcomputer 7H is provided with a CPU 7H1, a memory 7H2, and a communication interface 7H3. The functions of the CPU 7H1 are the same as the functions of the CPU 1H1, and the functions of the memory 7H2 are the same as the functions of the memory 1H2. The communication interface 7H3 is an interface which performs communication with the various devices of the component mounting machine 2, and it is possible to use a well-known LAN interface, for example.

The host computer 9 which controls the component mounting machine 2 is provided in the component mounting machine 2. The host computer 9 and the control device 7 of the component mounting machine 2 are connected to each other by a wired or a wireless communication line 1C1 to be capable of communication. The communication line 1C1 may use a LAN, for example, and various data and control signals are transmitted and received via the communication line 1C1. Similarly, the stepping motor control device 1 and the control device 7 of the component mounting machine 2, and the control device 7 and the various installation devices of the component mounting machine 2 (the component camera 6 is depicted in FIG. 3) are connected to each other by the communication line 1C1 to be capable of communication.

The control device 7 of the component mounting machine 2 is capable of downloading a production program created by the host computer 9 via the communication line 1C1. If the control device 7 of the component mounting machine 2 is perceived as control blocks, the control device 7 includes a mounting control section which controls the mounting of components. The mounting control section mounts components onto a board according to a production program which is assigned to the component mounting machine of the mounting control section. Regarding the component mounting machine 2, it is possible to arrange the component mounting machines 2 in a plurality of stages in series to configure a component mounting module, and it is possible to mount components in cooperation with the other component mounting machines 2.

The mounting control section mounts components onto the board based on the production program by causing the board conveyance device 3, the component supply device 4, the component transfer device 5, and the component camera 6 to operate. Specifically, the component mounting head 52 of the component transfer device 5 first moves to the feeder 41 of the component supply device 4 and sucks a component according to the instruction of the mounting control section. Next, the component mounting head 52 moves above the component camera 6, and the component camera 6 images the component which is sucked and held by the suction nozzle 53.

The control device 7 (the image processing device) detects positional shifting and angular shifting of the component in relation to the suction nozzle 53, and corrects the mounting position. The component mounting head 52 corrects the mounting angle of the component by rotating the suction nozzle 53 by the amount of angular shifting which is detected. Next, the component mounting head 52 moves to the mounting position of the component on the board which is carried to and positioned at the mounting position by the board conveyance device 3, mounts the component, and returns to the component supply device 4. The component mounting machine 2 is capable of mounting a plurality of components onto the board by repeating this series of operations.

Stepping Motor Control Device 1
Stepping Motor M1

The stepping motor control device 1 drives and controls the stepping motor M1. For the stepping motor M1, it is possible to use a well-known variable reluctance type (VR type) stepping motor, a permanent magnet type (PM type) stepping motor, a hybrid type (HB type) stepping motor, or the like. In the present embodiment, to facilitate explanation, the stepping motor M1 is explained using a PM type stepping motor as an example; however, it is possible to apply the present disclosure to other stepping motors in the same manner.

Figure 4:
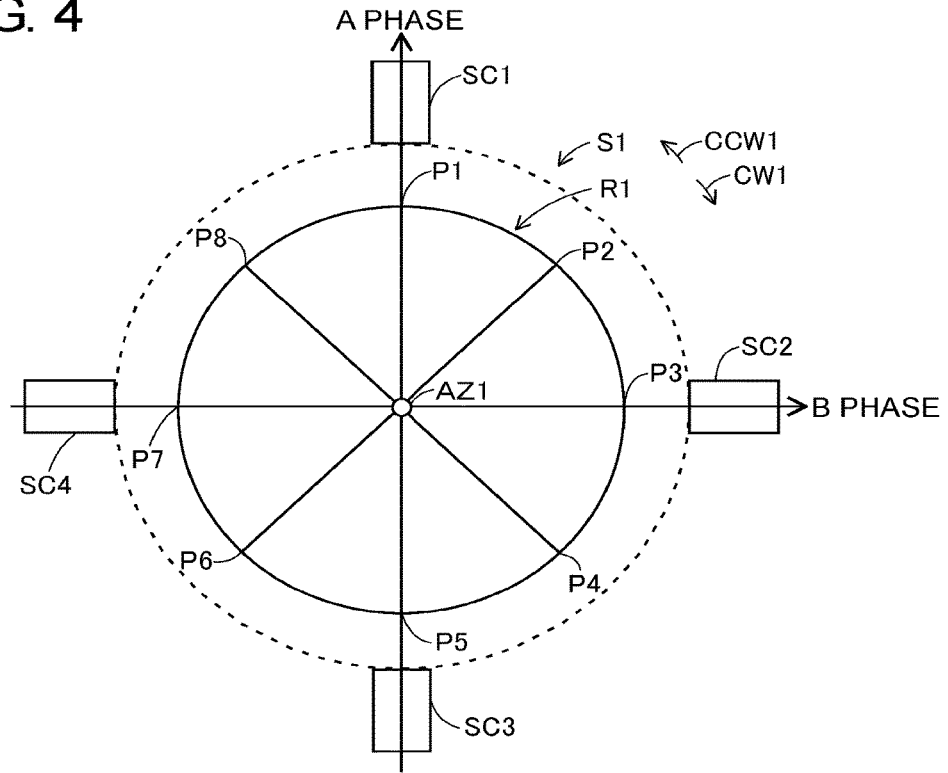
FIG. 4 is an explanatory diagram explaining mover stopping positions of a stepping motor M1 as viewed in an axis AZ1 direction.

FIG. 4 is an explanatory diagram explaining the mover stopping positions of the stepping motor M1 as viewed in the axis AZ1 direction. The stepping motor M1 is provided with a mover R1 and a stator S1, the mover R1 is supported to be capable of rotating relative to the stator S1. The stator S1 is provided with a core and a plurality of coils which are stored in slots formed in the core. The core is formed by a plurality of layers of thin-plate form electromagnetic steel sheet being laminated in the axis AZ1 direction of the stator S1. For the electromagnetic steel sheet, it is possible to use a silicon steel sheet, for example. FIG. 4 illustrates the electrical positional relationship between the stator S1 and the mover R1 as viewed from the axis AZ1 direction, and depiction of the core, the slots, the coils, and the like is omitted.

In the coil, the surface of the conductor is covered with an insulating layer such as an enamel. The cross-sectional shape of the coil is not particularly limited, and it is possible to use an arbitrary cross-sectional shape. For example, for the coil, it is possible to use conductors of various cross-sectional shapes such as a round wire with a circular cross-sectional shape or an angled wire with a polygonal cross-sectional shape. It is possible to wind the coil using a concentrated winding method. The coil is excited due to the application of a direct current voltage to the coil, and the excited coil forms stator magnetic poles SC1, SC2, SC3, and SC4.

The mover R1 is formed in a columnar shape by a plurality of layers of thin-plate form electromagnetic steel sheet being laminated in the rotating shaft direction (the axis AZ1 direction) of the mover R1. A plurality (a predetermined number of magnetic poles worth) of permanent magnets are provided on the outer circumferential surface of the mover R1 along the circumferential direction of the mover R1. Each of the plurality of permanent magnets extends in the rotating shaft direction (the axis AZ1 direction). In the PM type stepping motor, the magnetic flux density is increased by the excited mover magnetic poles, and the torque characteristics are improved in comparison to a VR type stepping motor. This is the same regarding the HB type stepping motor.

Control of Stepping Motor M1

Figure 5:
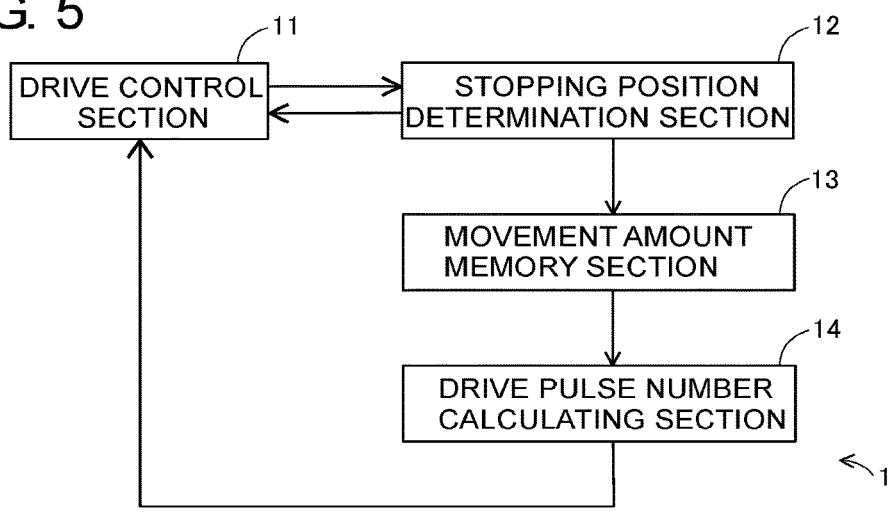
FIG. 5 is a block diagram illustrating an example of control blocks of the stepping motor control device 1.

FIG. 5 is a block diagram illustrating an example of control blocks of the stepping motor control device 1. If the stepping motor control device 1 is perceived as control blocks, the stepping motor control device 1 is provided with a drive control section 11, a stopping position determination section 12, a movement amount memory section 13, and a drive pulse number calculating section 14.

Drive Control Section 11 And Stopping Position Determination Section 12

The drive control section 11 drives and controls the stepping motor M1 using half-step driving or micro-step driving. FIG. 6 is an explanatory diagram explaining an example of excitation patterns. FIG. 6 illustrates an example of excitation patterns of the half-step driving. FIG. 7 is an explanatory diagram explaining the step angle by half-step driving.

For example, the excitation pattern of No. 1 denoted in FIG. 6 applies a direct current voltage to the coil (the A phase coil) corresponding to the stator magnetic poles SC1 and SC3. As a result, an S pole is formed on the stator magnetic pole SC1 side, and an N pole is formed on the stator magnetic pole SC3 side. At this time, a direct current voltage is not applied to the coil (the B phase coil) corresponding to the stator magnetic poles SC2 and SC4. In other words, the excitation pattern of No. 1 is an excitation pattern in which only one phase (the A phase coil) is excited. In FIG. 6, "ON (polarity)" indicates that a direct current voltage is applied to a corresponding coil and a magnetic pole is formed, and "OFF" indicates that no direct current voltage is applied to the corresponding coil, and no magnetic pole is formed.

During the excitation pattern of No. 1, the mover R1 rotates such that the N pole is disposed in a position P1 indicated in FIG. 4 and the S pole is disposed in a position P5, and the mover R1 is held in this state. In the present description, to facilitate explanation, the stopping position of the mover R1 will refer to the position in which the N pole of the mover R1 is disposed. The mover magnetic pole number is not limited to two.

The excitation pattern of No. 2 denoted in FIG. 6 applies a direct current voltage to the coil (the A phase coil) corresponding to the stator magnetic poles SC1 and SC3. As a result, an S pole is formed on the stator magnetic pole SC1 side, and an N pole is formed on the stator magnetic pole SC3 side. The excitation pattern of No. 2 further applies a direct current voltage to the coil (the B phase coil) corresponding to the stator magnetic poles SC2 and SC4. As a result, an S pole is formed on the stator magnetic pole SC2 side, and an N pole is formed on the stator magnetic pole SC4 side. In other words, the excitation pattern of No. 2 is an excitation pattern in which two phases (the A phase coil and the B phase coil) are excited.

During the excitation pattern of No. 2, the mover R1 rotates such that the N pole is disposed in a position P2 indicated in FIG. 4 and the S pole is disposed in a position P6, and the mover R1 is held in this state. In other words, the mover R1 is rotated in an arrow CW1 direction by 45° (electrical angle) from the holding state induced by the excitation pattern of No. 1. The arrow CW1 direction depicted in FIG. 4 indicates the movement direction of the mover R1, and an arrow CCW1 direction indicates an opposite direction from the movement direction of the mover R1.

The same is true of the excitation patterns of No. 3 to No. 8 denoted in FIG. 6, and excitation patterns in which only the coils of one phase are excited and excitation patterns in which the coils of two phases are excited are repeated. Every time the excitation pattern switches, the mover R1 rotates by 45° (electrical angle) in the arrow CW1 direction. In other words, as illustrated in FIG. 7, the drive control section 11 is capable of performing 1-2 phase excitation in which 1 step is 45° (electrical angle).

As illustrated in FIG. 4, the positions corresponding to the stator magnetic poles SC1, SC2, SC3, and SC4 among the mover stopping positions P1 to P8 of the stepping motor M1 are referred to as the stabilized phases P1, P3, P5, and P7, respectively, and are the stator stopping positions during an excitation pattern in which only the coils of one phase are excited (refer to FIG. 6). Meanwhile, the intermediate positions of the adjacent stabilized phases are referred to as semistable phases, and are the mover stopping positions during the excitation patterns in which the coils of two phases are excited (refer to FIG. 6).

Specifically, the intermediate position of the adjacent stabilized phases (P1, P3) is the semistable phase P2, and the intermediate position of the adjacent stabilized phases (P3, P5) is the semistable phase P4. Similarly, the intermediate position of the adjacent stabilized phases (P5, P7) is the semistable phase P6, and the intermediate position of the adjacent stabilized phases (P7, P1) is the semistable phase P8.

The drive control section 11 is also capable of driving and controlling the stepping motor M1 using micro-step driving. FIG. 8 is an explanatory diagram explaining a step angle by micro-step driving. The micro-step driving increases the excitation patterns by subdividing the current ratios of the A phase coils and the B phase coils in the excitation patterns of the half-step driving denoted in FIG. 6. As a result, the micro-step driving is capable of decreasing the step angle in comparison to the half-step driving.

As illustrated in FIG. 8, the space between the stabilized phase P1 and the semistable phase P2 is divided into four equal parts, for example. The same applies to the other zones, and 1 step is set to 11.25° (electrical angle). Even in the micro-step driving, it is necessary that the mover stopping positions of the stepping motor M1 be stabilized phases (P1, P3, P5, P7) or semistable phases (P2, P4, P6, P8).

The control states of the stepping motor M1 include a moving state, a holding state, and a standby state. The moving state refers to a state in which the mover R1 is moving (in the present embodiment, rotating, same hereinafter) toward the instructed target position. The holding state refers to a state in which the mover R1 reaches the instructed target position and is held at the target position. The standby state refers to a state in which the holding of the mover R1 is released. In the present embodiment, the control state of the stepping motor M1 transitions in order of moving state, holding state, standby state, which is repeated; however, the transition order of the control state is not limited thereto.

The stopping position determination section 12 determines which of the stabilized phases (P1, P3, P5, P7) and the semistable phases (P2, P4, P6, P8) the mover stopping position is during the holding state. For example, the stopping position determination section 12 acquires the excitation pattern of the coils during the holding state (the excitation pattern of the coils denoted in FIG. 6) from the drive control section 11, and is capable of determining the mover stopping position during the holding state.

Specifically, during an excitation pattern (for example, the excitation pattern of No. 1 denoted in FIG. 6) in which only one phase is excited, the stopping position determination section 12 determines that the mover stopping position during the holding state is the stabilized phase P1. Meanwhile, during an excitation pattern (for example, the excitation pattern of No. 2 denoted in FIG. 6) in which two phases are excited, the stopping position determination section 12 determines that the mover stopping position during the holding state is the semistable phase P2. This applies to the other stabilized phases (P3, P5, P7) and the semistable phases (P4, P6, P8) in the same manner.

When it is determined that the mover stopping position is a semistable phase during the holding state by the stopping position determination section 12, the drive control section 11 changes the mover stopping position to one of the stabilized phases adjacent to the mover stopping position during the holding state at a predetermined timing at which the holding of the mover R1 is released. Assume that the mover stopping position during the holding state is determined to be the semistable phase P2 by the stopping position determination section 12, for example. At this time, the drive control section 11 changes the mover stopping position to one of the stabilized phase P1 and the stabilized phase P3 which are adjacent. This applies in the same manner to a case in which the mover stopping position during the holding state is another metastable phase (P4, P6, P8).

As described above, the stabilized phases (P1, P3, P5, P7) are mover stopping positions by excitation patterns in which only one phase (an A phase coil or a B phase coil) is excited. Meanwhile, the semistable phases (P2, P4, P6, P8) are mover stopping positions by excitation patterns in which two phases (an A phase coil and a B phase coil) are excited. The excitation patterns in which only one phase (an A phase coil or a B phase coil) is excited have low power consumption during excitation in comparison with the excitation patterns in which two phases (an A phase coil and a B phase coil) are excited.

The stepping motor control device 1 of the present embodiment is provided with the stopping position determination section 12 and the drive control section 11. Accordingly, the drive control section 11 is capable of setting the stepping motor M1 to the standby state in a stabilized phase (P1, P3, P5, P7) in which the power consumption is low in comparison to a semi stable phase (P2, P4, P6, P8) based on the determination results of the stopping position determination section 12. Therefore, the stepping motor control device 1 of the present embodiment is capable of positioning the stepping motor M1 at a desired target position and of reducing the power consumption of the stepping motor M1 in the standby state in which the holding state of the positioning is released.

A predetermined timing refers to when the control state of the stepping motor M1 transitions from the holding state to the standby state in which the holding of the mover R1 is released due to a trigger signal from a device or the holding state persisting for a fixed time. For example, if the drive control section 11 uses a trigger signal which is transmitted from an image processing device (in the present embodiment, the control device 7) as the trigger signal from the device.

When the image processing device starts loading an image which is captured by the component camera 6, a trigger signal indicating that the control state of the stepping motor M1 is transitioned from the holding state to the standby state may be transmitted to the drive control section 11. In this case, the stepping motor control device 1 is capable of ascertaining that the suction of a component is completed due to the reception of the trigger signal from the image processing device.

According to the present embodiment, the drive control section 11 uses the trigger signal which is transmitted from the image processing device as the trigger signal from a device. Accordingly, the stepping motor control device 1 is capable of transitioning the control state of the stepping motor M1 from the holding state to the standby state at an appropriate timing at which the suction of the component is completed. Accordingly, the stepping motor control device 1 is capable of reducing the power consumption of the stepping motor M1 at the appropriate timing at which the suction of the component is completed.

The device is not limited to being an external device such as the image processing device, and may be an internal device which is provided in the feeder 41. For example, it is possible to provide the feeder 41 with a detector (for example, a well-known proximity sensor or the like) which detects a component in the vicinity of the component pickup section 47. In this case, the detector detects the completion of the suction of the component, and the drive control section 11 is capable of ascertaining that the suction of the component is completed by receiving the detection signal from the detector.

It is possible to provide the stepping motor control device 1 with a well-known time counting section. When the holding state persists for a fixed time, the time counting section may transmit an interrupt signal to the drive control section 11. The fixed time maybe set to a required time from the mover R1 reaching the instructed target position until the suction of the component is completed, for example. In this case, the drive control section 11 is capable of ascertaining that the suction of the component is completed by receiving the interrupt signal from the time counting section.

Assume that the drive control section 11 changes the mover stopping position to the stabilized phase P3 of the same direction as the movement direction (the arrow CW1 direction) of the mover R1 of the stabilized phase P1 and the stabilized phase P3 which are adjacent to the mover stopping position during the holding state, for example. In this case, the movement of the mover R1 causes a toothed wheel (not illustrated) which is engaged with the stepping motor M1 to rotate by an amount corresponding to the movement of the mover R1. The rotation of the toothed wheel causes the sprocket 44 to rotate. The rotation of the sprocket 44 moves the component tape 431. In other words, the component tape 431 moves in the pitch feed direction by an amount corresponding to the movement in the arrow CW1 direction by the mover R1. However, it is desirable for the component tape 431 to be as static as possible.

Therefore, it is favorable that the drive control section 11 changes the mover stopping position to the stabilized phase of the opposite direction (the arrow CCW1 direction) from the movement direction (the arrow CW1 direction) of the mover R1 of the stabilized phases which are adjacent to the mover stopping position during the holding state. Assume that the mover stopping position during the holding state is set to the semistable phase P2, for example. At this time, the drive control section 11 changes the mover stopping position to the stabilized phase P1 of the opposite direction (the arrow CCW1 direction) from the movement direction (the arrow CW1 direction) of the mover R1 of the stabilized phase P1 and the stabilized phase P3 which are adjacent. This applies to the other semistable phases (P4, P6, P8) in the same manner.

The drive control section 11 of the present embodiment changes the mover stopping position to the stabilized phase of the opposite direction (the arrow CCW1 direction) from the movement direction (the arrow CW1 direction) of the mover R1 of the stabilized phases which are adjacent to the mover stopping position during the holding state. In this case, the movement amount of the mover R1 is absorbed or reduced by a backlash between the stepping motor M1 and the toothed wheel which is engaged therewith. Accordingly, even if the mover R1 moves in the arrow CCW1 direction, the toothed wheel which is engaged with the stepping motor M1 is not rotated by an amount corresponding to the movement of the mover R1. Even in a case in which the movement amount of the mover R1 is not completely absorbed by the backlash with the toothed wheel, the movement amount of the mover R1 is absorbed or reduced by a backlash of other toothed wheels or the like interposed between the toothed wheel and the sprocket 44, a backlash between the sprocket 44 and the component tape 431, and the like. Accordingly, the stepping motor control device 1 is capable of suppressing the movement of the component tape 431 to a minimum amount even if the mover R1 is moved to a stabilized phase.

Movement Amount Memory Section 13

The movement amount memory section 13 stores a standby time movement amount. The standby time movement amount is a drive pulse number when the mover R1 moves from the mover stopping position of the holding state to the mover stopping position of the standby state. Assume that the mover stopping position during the holding state is determined to be the semistable phase P2 by the stopping position determination section 12, for example. And assume that the drive control section 11 changes the mover stopping position to the stabilized phase P1.

During the half-step driving, the movement amount is 1 step worth when the mover R1 moves from the mover stopping position (the semistable phase P2) of the holding state to the mover stopping position (the stabilized phase P1) of the standby state. Accordingly, the movement amount memory section 13 stores 1 step worth of the drive pulse number (1 pulse) as the standby time movement amount. Meanwhile, during the micro-step driving, the movement amount is 4 steps worth when the mover R1 moves from the mover stopping position (the semistable phase P2) of the holding state to the mover stopping position (the stabilized phase P1) of the standby state. Accordingly, the movement amount memory section 13 stores 4 steps worth of the drive pulse number (4 pulses) as the standby time movement amount.

Drive Pulse Number Calculating Section 14

The drive pulse number calculating section 14 calculates the drive pulse number which is necessary for moving the mover R1 from the mover stopping position of the standby state to the next target position. Assume that the next target position is the stabilized phase P7 in the example described above. During the half-step driving, the drive pulse number which is necessary for the mover R1 to move from the mover stopping position (the semistable phase P2) of the holding state to the next target position (the stabilized phase P7) is 5 pulses.

During the half-step driving, the drive pulse number calculating section 14 adds the standby time movement amount (1 pulse) which is stored in the movement amount memory section 13 to the drive pulse number 5, and calculates the drive pulse number (6 pulses) which is necessary for the mover R1 to move from the mover stopping position (the stabilized phase P1) of the standby state to the next target position (the stabilized phase P7).

Meanwhile, during the micro-step driving, the drive pulse number which is necessary for the mover R1 to move from the mover stopping position (the semistable phase P2) of the holding state to the next target position (the stabilized phase P7) is 20 pulses. The drive pulse number calculating section 14 adds the standby time movement amount (4 pulses) which is stored in the movement amount memory section 13 to the drive pulse number 20, and calculates the drive pulse number (24 pulses) which is necessary for the mover R1 to move from the mover stopping position (the stabilized phase P1) of the standby state to the next target position (the stabilized phase P7).

Therefore, hypothetically, the drive control section 11 changes the mover stopping position to the stabilized phase of the same direction (the arrow CW1 direction) as the movement direction (the arrow CW1 direction) of the mover R1 of the stabilized phases which are adjacent to the mover stopping position during the holding state. Assume that the mover stopping position during the holding state is determined to be the semistable phase P2 by the stopping position determination section 12, for example. And assume that the drive control section 11 changes the mover stopping position to the stabilized phase P3. Suppose that the next target position is the stabilized phase P7.

Even in this case, during the half-step driving, the movement amount is 1 step worth when the mover R1 moves from the mover stopping position (the semistable phase P2) of the holding state to the mover stopping position (the stabilized phase P3) of the standby state. Accordingly, the movement amount memory section 13 stores 1 step worth of the drive pulse number (1 pulse) as the standby time movement amount. The same applies to the micro-step driving, and the movement amount memory section 13 stores 4 steps worth of the drive pulse number (4 pulses) as the standby time movement amount.

During the half-step driving, the drive pulse number which is necessary for the mover R1 to move from the mover stopping position (the semistable phase P2) of the holding state to the next target position (the stabilized phase P7) is 5 pulses. Accordingly, the drive pulse number calculating section 14 subtracts the standby time movement amount (1 pulse) which is stored in the movement amount memory section 13 from the drive pulse number 5, and calculates the drive pulse number (4 pulses) which is necessary for the mover R1 to move from the mover stopping position (the stabilized phase P3) of the standby state to the next target position (the stabilized phase P7).

Meanwhile, during the micro-step driving, the drive pulse number which is necessary for the mover R1 to move from the mover stopping position (the semistable phase P2) of the holding state to the next target position (the stabilized phase P7) is 20 pulses. Accordingly, the drive pulse number calculating section 14 subtracts the standby time movement amount (4 pulse) which is stored in the movement amount memory section 13 from the drive pulse number 20, and calculates the drive pulse number (16 pulses) which is necessary for the mover R1 to move from the mover stopping position (the stabilized phase P3) of the standby state to the next target position (the stabilized phase P7).

The drive pulse number which is calculated by the drive pulse number calculating section 14 is transferred to the drive control section 11. The drive control section 11 applies the drive pulse number worth of a direct current voltage to the corresponding coils based on the excitation pattern. Accordingly, the mover R1 moves from the mover stopping position (for example, the stabilized phase P1 or the stabilized phase P3) of the standby state to the next target position (for example, the stabilized phase P7).

The stepping motor control device 1 of the present embodiment is provided with the movement amount memory section and the drive pulse number calculating section 14. Accordingly, the drive pulse number calculating section 14 adds or subtracts the standby time movement amount which is stored in the movement amount memory section 13, and is capable of calculating the drive pulse number which is necessary for the mover R1 to move from the mover stopping position of the standby state to the next target position. Therefore, in a case in which the mover stopping position is changed from the mover stopping position during the holding state to the mover stopping position during the standby state, the stepping motor control device 1 is capable of calculating the drive pulse number which is necessary for moving the mover R1 to the next target position.

Figure 9:
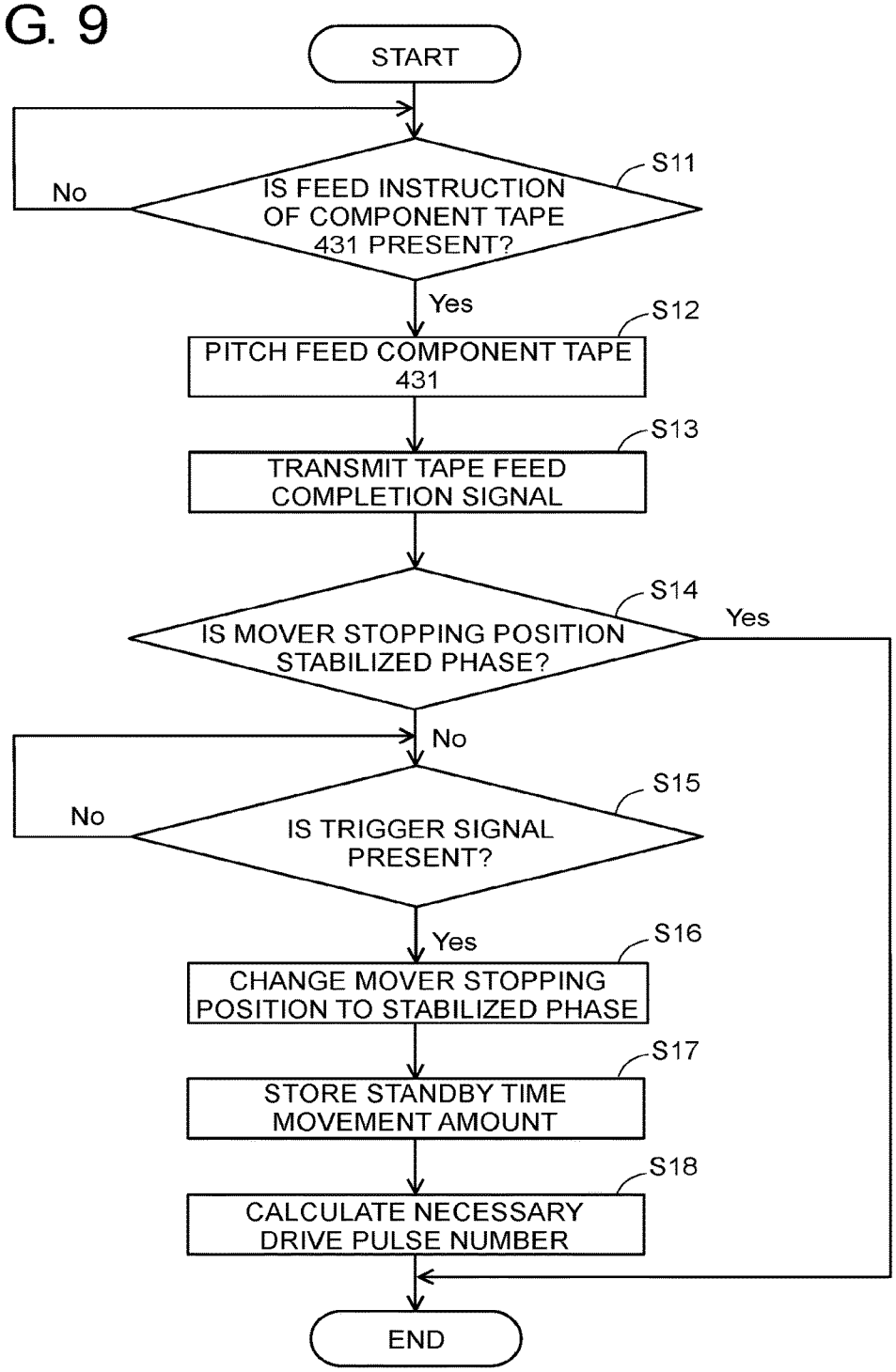
FIG. 9 is a flowchart illustrating an example of a control flow of the stepping motor control device 1.

FIG. 9 is a flowchart illustrating an example of the control flow of the stepping motor control device 1. The drive control section 11, the stopping position determination section 12, the movement amount memory section 13, and the drive pulse number calculating section 14 are stored in the memory 1H2 as a program, and are read from the memory 1H2 before the start of production. The stepping motor control device 1 drives and controls the stepping motor M1 which is provided in the feeder 41 by executing the program according to the flow illustrated in FIG. 9.

First, the drive control section 11 recognizes whether or not a feed instruction of the component tape 431 from the control device 7 is present (step S11). In a case in which the feed instruction of the component tape 431 is present (the Yes case), the control proceeds to the next step S12. In a case in which the feed instruction of the component tape 431 is not present (the No case), the drive control section 11 waits until the feed instruction of the component tape 431 from the control device 7 is present.

Next, the drive control section 11 moves the mover R1 to the instructed target position and causes the sprocket 44 to rotate. As a result, the component tape 431 is pitch fed (step S12). When the pitch feeding of the component tape 431 is completed, the control state of the stepping motor M1 transitions from the moving state to the holding state. At this time, the drive control section 11 transmits a tape feed completion signal indicating that the pitch feeding of the component tape 431 is completed to the control device 7 (step S13).

The stopping position determination section 12 determines whether the mover stopping position during the holding state is a stabilized phase or a semistable phase (step S14). In a case in which the mover stopping position during the holding state is a stabilized phase (the Yes case), the control is ended once. In a case in which the mover stopping position during the holding state is a semistable phase (the No case), the control proceeds to the next step S15.

The drive control section 11 confirms whether or not the trigger signal is received from the control device 7 (the image processing device) (step S15). As described previously, the trigger signal indicates that the control state of the stepping motor M1 is transitioned from the holding state to the standby state. In a case in which the trigger signal is received (the Yes case), the control proceeds to the next step S16. In a case in which the trigger signal is not received (the No case), the drive control section 11 waits until the trigger signal is received from the control device 7 (the image processing device). In a case in which the holding state persists for a fixed time, the control may proceed to the next step S16.

Next, the drive control section 11 changes the mover stopping position to one of the stabilized phases which are adjacent to the mover stopping position during the holding state (step S16). In the present embodiment, the drive control section 11 changes the mover stopping position to the stabilized phase of the opposite direction (the arrow CCW1 direction) from the movement direction (the arrow CW1 direction) of the mover R1 of the adjacent stabilized phases.

The movement amount memory section 13 stores the standby time movement amount (step S17). The drive pulse number calculating section 14 calculates the drive pulse number which is necessary for moving the mover R1 from the mover stopping position of the standby state to the next target position (step S18). The control ends once. The control indicated by this flowchart is executed repeatedly at a predetermined interval.

Figure 10:
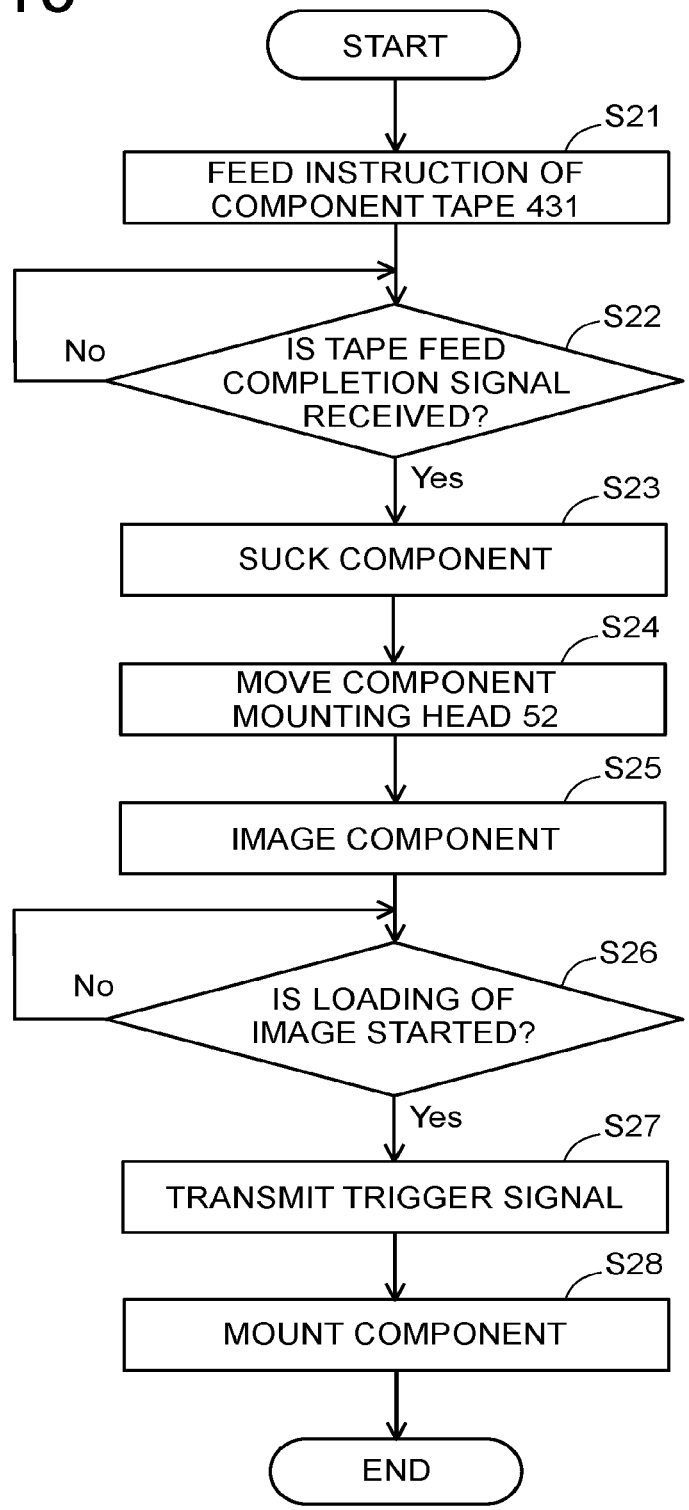
FIG. 10 is a flowchart illustrating an example of a control flow of the control device 7.

FIG. 10 is a flowchart illustrating an example of the control flow of the control device 7. The mounting control section of the control device 7 is stored in the memory 7H2 as a program, and is read from the memory 7H2 before the start of production. The control device 7 mounts components onto the board by causing the board conveyance device 3, the component supply device 4, the component transfer device 5, and the component camera 6 to operate by executing the production program according to the flow illustrated in FIG. 10.

First, the control device 7 transmits a feed instruction of the component tape 431 to the feeder 41 (step S21). The control device 7 confirms whether or not a tape feed completion signal is received from the drive control section 11 of the feeder 41 (step S22). In a case in which the tape feed completion signal is received (the Yes case), the control proceeds to the next step S23. In a case in which the tape feed completion signal is not received (the No case), the control device 7 waits until the tape feed completion signal is received.

Next, the component mounting head 52 of the component transfer device 5 moves to the feeder 41 of the component supply device 4 and sucks a component according to the instruction from the control device 7 (step S23). The component mounting head 52 moves above the component camera 6 (step S24), and the component camera 6 images the component which is sucked and held by the suction nozzle 53 (step S25).

The control device 7 (the image processing device) confirms whether or not the loading of the image which is captured by the component camera 6 is started (step S26). In a case in which the loading of the image is started (the Yes case), the image processing device transmits a trigger signal indicating that the control state of the stepping motor M1 is transitioned from the holding state to the standby state to the drive control section 11 (step S27). In a case in which the loading of the image is not started (the No case), the image processing device starts the loading of the image.

Next, the component mounting head 52 moves to the mounting position of the component on the board which is carried to and positioned at the mounting position by the board conveyance device 3, and mounts the component (step S28). The control ends once. The control indicated by this flowchart is executed repeatedly at a predetermined interval.

The feeder 41 of the component mounting machine 2 of the present embodiment is provided with the feeder main body section 411, the component supply reel 43 onto which the component tape 431 which stores a plurality of components is wound, the sprocket 44 which pitch feeds the component tape 431, the stepping motor M1 which causes the sprocket 44 to rotate, and the stepping motor control device 1 which controls the stepping motor M1. In other words, the stepping motor control device 1 is provided in the feeder 41. Accordingly, the stepping motor control device 1 is capable of reducing the standby power of the feeder 41.

Generally, when the standby power of the feeder 41 increases, the amount of generated heat during standby increases. When the amount of generated heat during standby increases, static electricity occurs more easily in the feeder 41. There is a case in which the feeder 41 supplies electronic components which are weak to high temperatures or static electricity. When static electricity occurs in the feeder 41, there is a case in which the electronic components jump out from the component tape 431 and the suction nozzle 53 may not be capable of correctly sucking to the electronic components. Therefore, in addition to a reduction in the standby power, the suppression of the amount of generated heat and the suppression of static electricity during standby become necessary. Since the stepping motor control device 1 of the present embodiment is capable of reducing the standby power of the feeder 41, it is possible to reduce the amount of generated heat during standby of the feeder 41, and to suppress the static electricity which occurs in the feeder 41. Accordingly, in the component mounting machine 2 of the present embodiment, the standby power of the feeder 41 is reduced, and a heat generation countermeasure and a static electricity countermeasure of the feeder 41 are reduced.

If a PM type stepping motor or an HB type stepping motor is used for the stepping motor M1, it is possible to reduce the positional shifting of the mover R1 when the power is off using the detent torque, which is favorable.

Stepping Motor Control Method

The present disclosure may be perceived as a stepping motor control method. The present disclosure may be perceived as a stepping motor control program which causes the microcomputer 1H to execute a stepping motor control method. In the stepping motor control method and the stepping motor control program, "XX section" described earlier in the stepping motor control device 1 may be re-read as "XX step". In other words, the drive control section 11 may be re-read as a drive control step, and the stopping position determination section 12 may be re-read as a stopping position determination step. The movement amount memory section 13 may be re-read as a movement amount memory step, and the drive pulse number calculating section 14 may be re-read as a drive pulse number calculating step. The explanation of each step is the same as the explanations given earlier, and thus, redundant description will be omitted.

The stepping motor control method of the present embodiment is a stepping motor control method which controls a stepping motor using half-step driving or micro-step driving, and is provided with a stopping position determination step and a drive control step. The stopping position determination step is a step of determining which of the stabilized phases (P1, P3, P5, P7) and the semistable phases (P2, P4, P6, P8) the mover stopping position is during the holding state in which the mover R1 has reached the instructed target position and is held in the target position.

The stabilized phases (P1, P3, P5, P7) refer to the positions corresponding to the stator magnetic poles SC1, SC2, SC3, and SC4 among the mover stopping positions P1 to P8 of the stepping motor M1. The semistable phases (P2, P4, P6, P8) refer to the intermediate positions of the adjacent stabilized phases among the mover stopping positions P1 to P8 of the stepping motor M1.

When it is determined that the mover stopping position is a semistable phase (P2, P4, P6, P8) during the holding state by the stopping position determination step, and the control state of the stepping motor M1 transitions from the holding state to the standby state in which the holding of the mover R1 is released due to a trigger signal from a device or the holding state persisting for a fixed time, the drive control step is a step of changing the mover stopping position to one of the stabilized phases adjacent to the mover stopping position during the holding state.

The stepping motor control method of the present embodiment is provided with the stopping position determination step and the drive control step. Accordingly, the drive control step is capable of setting the stepping motor M1 to the standby state in a stabilized phase (P1, P3, P5, P7) in which the power consumption is low in comparison to a semistable phase (P2, P4, P6, P8) based on the determination results of the stopping position determination step. Therefore, the stepping motor control method of the present embodiment is capable of positioning the stepping motor M1 at a desired target position and of reducing the power consumption of the stepping motor M1 in the standby state in which the holding state of the positioning is released.

Appendix

The following technical ideas are ascertained from the above description.

Appendix 1

The drive control step is a stepping motor control method which changes the mover stopping position to the stabilized phase of an opposite direction from a movement direction of the mover among the stabilized phases which are adjacent to the mover stopping position during the holding state.

Appendix 2

The stepping motor control method according to includes: a movement amount memory step of storing a standby time movement amount which is a drive pulse number when the mover moves from the mover stopping position of the holding state to the mover stopping position of the standby state, and a drive pulse number calculating step of adding or subtracting the standby time movement amount which is stored in the movement amount memory section to or from a drive pulse number which is necessary for moving the mover from the mover stopping position of the holding state to a next target position, and calculating the drive pulse number which is necessary for the mover to move from the mover stopping position of the standby state to the next target position.

Other

The present disclosure is not limited to only the embodiment described above and illustrated in the drawings, and may be modified as appropriate and carried out without departing from the scope of the gist. For example, the stepping motor M1 is not limited to a two phase excitation stepping motor, and it is possible to use an N phase excitation stepping motor. Where N is a natural number greater than or equal to 2. In this case, the drive control section 11 is capable of performing (N−1)−N phase excitation. In other words, in the excitation pattern, an excitation pattern in which (N−1) phase coils are excited, and an excitation pattern in which N phase coils are excited are repeated. Accordingly, the stepping motor control device 1 is capable of obtaining the same operations and effects as those described earlier in the embodiment for an N phase excitation stepping motor.

In the embodiment, the stepping motor M1 and the stepping motor control device 1 are provided with the feeder 41; however, the configuration is not limited thereto. Starting with control motors of installation devices which are installed on the component mounting machine, it is possible to widely apply the present disclosure to the control of various motors for which a reduction in power consumption is anticipated.

In the embodiment, the stepping motor M1 is a radial gap cylindrical motor in which the mover R1 and the stator S1 are disposed concentrically with the radial direction of the stator S1; however, the configuration is not limited thereto. For example, the stepping motor M1 may be a linear stepping motor in which the mover R1 moves linearly in relation to the stator S1.

REFERENCE SIGNS LIST

1: stepping motor control device, M1: stepping motor, R1: mover, SC1, SC2, SC3, SC4: stator magnetic pole, P1, P3, P5, P7: stabilized phase, P2, P4, P6, P8: semistable phase, 11: drive control section, 12: stopping position determination section, 13: movement amount memory section, 14: drive pulse number calculating section, 2: component mounting machine, 3: board conveyance device, 4: component supply device, 41: feeder, 411: feeder main body section, 43: component supply reel, 431: component tape, 44: sprocket, 5: component transfer device, 53: suction nozzle, 6: component camera, 7: control device (image processing device).

The invention claimed is:

1. A stepping motor control device which controls a stepping motor using half-step driving or micro-step driving, comprising:
a stopping position determination section which, when positions corresponding to stator magnetic poles are set to stabilized phases and intermediate positions between the stabilized phases which are adjacent are set to semistable phases among mover stopping positions of the stepping motor, determines which of the stabilized phases and semistable phases the mover stopping position is during a holding state in which the mover reaches an instructed target position and is held at the target position; and
a drive control section which, when it is determined that the mover stopping position is the semistable phase during the holding state by the stopping position determination section, and the control state of the stepping motor transitions from the holding state to a standby state in which holding of the mover is released due to a trigger signal from a device or the holding state persisting for a fixed time, changes the mover stopping position to one of the stabilized phases adjacent to the mover stopping position during the holding state.

2. The stepping motor control device according to claim 1,
wherein the drive control section changes the mover stopping position to the stabilized phase of an opposite direction from a movement direction of the mover among the stabilized phases which are adjacent to the mover stopping position during the holding state.

3. The stepping motor control device according to claim 1, further comprising:
a movement amount memory section which stores a standby time movement amount which is a drive pulse number when the mover moves from the mover stopping position of the holding state to the mover stopping position of the standby state; and
a drive pulse number calculating section which adds or subtracts the standby time movement amount which is stored in the movement amount memory section to or from a drive pulse number which is necessary for moving the mover from the mover stopping position of the holding state to a next target position, and calculates the drive pulse number which is necessary for the mover to move from the mover stopping position of the standby state to the next target position.

4. A component mounting machine, comprising:
a board conveyance device which carries a board to and from a mounting position;
a component supply device which includes a feeder which supplies components to be mounted onto the board; and
a component transfer device which sucks the components from the feeder and mounts the components onto the board which is carried to the mounting position,
wherein the feeder includes
a feeder main body section,
a component supply reel onto which a component tape which stores a plurality of components is wound,
a sprocket which pitch feeds the component tape,
a stepping motor which causes the sprocket to rotate, and the stepping motor control device according to claim 1 which controls the stepping motor.

5. The component mounting machine according to claim 4, further comprising:
- a component camera which is provided between the component supply device and the board conveyance device and which images a component which is sucked and held by a suction nozzle of the component transfer device; and
- an image processing device which acquires an suction state of the component from an image which is captured by the component camera,
- wherein the image processing device, when loading of the image which is captured by the component camera is started, transmits the trigger signal indicating that a control state of the stepping motor is transitioned from the holding state to the standby state to the drive control section.

6. A stepping motor control method which controls a stepping motor using half-step driving or micro-step driving, comprising:

- a stopping position determination step of, when positions corresponding to stator magnetic poles are set to stabilized phases and intermediate positions between the stabilized phases which are adjacent are set to semistable phases among mover stopping positions of the stepping motor, determining which of the stabilized phases and semistable phases the mover stopping position is during a holding state in which the mover reaches an instructed target position and is held at the target position; and
- a drive control step of, when it is determined that the mover stopping position is the semistable phase during the holding state by the stopping position determination step, and the control state of the stepping motor transitions from the holding state to a standby state in which holding of the mover is released due to a trigger signal from a device or the holding state persisting for a fixed time, changing the mover stopping position to one of the stabilized phases adjacent to the mover stopping position during the holding state.

* * * * *